United States Patent
Horai et al.

Patent Number: 6,113,687
Date of Patent: Sep. 5, 2000

[54] METHOD FOR MAKING A SILICON SINGLE CRYSTAL WAFER

[75] Inventors: Masataka Horai; Kazuyuki Egashira; Tadami Tanaka, all of Kishima-gun, Japan

[73] Assignee: Sumitomo Metal Industries, Ltd., Osaka, Japan

[21] Appl. No.: 09/193,251

[22] Filed: Nov. 17, 1998

[30] Foreign Application Priority Data

Nov. 19, 1997 [JP] Japan ..................................... 9-318704

[51] Int. Cl.⁷ ...................................................... C30B 15/20
[52] U.S. Cl. .................................. 117/20; 117/13; 117/19
[58] Field of Search ................................. 117/13, 19, 20

[56] References Cited

U.S. PATENT DOCUMENTS

| | | | |
|---|---|---|---|
| 5,954,873 | 9/1999 | Hourai et al. .......................... | 117/13 |
| 5,968,264 | 10/1999 | Iida et al. ............................... | 117/30 |

FOREIGN PATENT DOCUMENTS

| | | |
|---|---|---|
| 2-267195 | 10/1990 | Japan . |
| 8-330316 | 12/1996 | Japan . |
| 9-202690 | 8/1997 | Japan . |

OTHER PUBLICATIONS

Japanese Journal of Applied Physics; vol. 77, No. 7, 1997; by H. Yamamoto et al. (English abstract).
Journal of Crystal Growth 99 (1990) pp. 696–701, by S. Miyahara et al.
Journal of Crystal Growth 128 (1993), pp. 275–281, by T. Fujiwara et al.

*Primary Examiner*—Felisa Hiteshew
*Attorney, Agent, or Firm*—Armstrong, Westerman, Hattori, McLeland & Naughton

[57] ABSTRACT

A silicon single crystal wafer having good device characteristics can be manufactured according to the Czochralski method without formation of any dislocation cluster within a crystal surface. Where a silicon single crystal having an oxygen concentration of less than $8.5 \times 10^{17}$ atoms/cm³ (ASTM F1188-88) is manufactured, a radius of a latent zone of oxidation induced stacking defects ring-likely-distributed in the crystal surface is made within a range of 70% to 0% of a crystal radius, and a value of V/G (mm²/° C.·minute) is controlled at a predetermined critical value or over at radial positions except an outermost periphery of the crystal when a pulling rate is taken as V (mm/minute), and a crystalline temperature gradient along the pulling axis is taken as G (° C./mm). On the other hand, when a silicon single crystal having an oxygen concentration of not less than $8.5 \times 10^{17}$ atoms/cm³ (ASTM F1188-88) is manufactured, a pulling rate is further set at 1.0 mm/minute or over. In the method for manufacturing the silicon single crystal wafer, it is preferred to calculate the crystalline temperature gradient G along the pulling axis through heat transfer calculation, set the critical value of V/G at 0.20 mm²/° C.·minute, and control the value of V/G at a value larger than the critical value.

12 Claims, 6 Drawing Sheets

METHOD FOR MAKING A SILICON SINGLE CRYSTAL WAFER

FIELD OF THE INVENTION

This invention relates to a method for making a silicon single crystal suitable for use as a semiconductor device, and more particularly, to a method for making a high-quality silicon single crystal wafer which is substantially free of any harmful grown-in defects.

DESCRIPTION OF THE PRIOR ART

For the growth of a silicon single crystal used as a semiconductor material, many methods are known, among which the Czochralski method has now been in wide use. When subjected to thermal oxidation treatment (e.g. under conditions of 1000 to 1200° C.×1 to 10 hours) in an oxidative atmosphere, the silicon single crystal wafer made according to the Czochralski method may, in some cases, have ring likely distributed oxidation induced stacking faults hereinafter referred to simply as OSF ring). The zone where the OSF ring latently occurs or breaks out is influenced by the pulling rate (mm/minute) of a single crystal being grown. When the pulling rate is decreased, the zone where the OSF ring appears is reduced from the peripheral side of the crystal toward the inner side. In other words, when a single crystal is grown at high pulling rates, the inside zone of the OSF ring is spread throughout the wafer. On the other hand, the growth at low rates results in the outside zone of the OSF ring being spread throughout the wafer.

It is known in the art that in the inside zone of the OSF ring of a single crystal wafer made according to the Czochralski method, there are formed octahedral voids which are assumed to consist of aggregates of vacancies; where MOS LSI's are manufactured, the voids degrade the characteristic of a gate oxide integrity (hereinafter referred to simply as GOI), and isolation failure takes place in an element isolation region; and where trench capacitors are used, a characteristic failure, such as the punch-through between adjacent capacitors, may occur (see, for example, Hidekazu Yamamoto & Hiroshi Koyama, Japanese Journal of Applied Physics, 66. 662 (1997)).

In order to cope with the above problems, a number of methods have been hitherto proposed. In Japanese Laid-open Patent Application No. 2-267195, there is proposed a method of making a silicon single crystal having a diameter of 100 mm or over according to the Czochralski method, in which the pulling rate is set at 0.8 mm/minute or below. More particularly, the pulling rate is set at a level as low as 0.8 mm/minute or below, by which a position where an OSF ring would break out is shrunk from the outer periphery of the crystal and disappears at the center of the crystal. It is stated that, according to this method, because the GOI is good in the outside zone of the OSF ring, the GOI characteristic can be further improved when the pulling rate is decreased.

Although the GOI characteristic is certainly upgraded according to the above-proposed method, oxidation induced stacking faults (hereinafter referred to simply as OSF) undesirably appear in the zone of the OSF ring upon thermal oxidation treatment using a pulling rate within a range of about 0.4 to 0.8 mm/minute. Moreover, when the pulling rate is made smaller than about 0.4 mm/minute, there arises the problem due to the dislocation cluster occurring in the outside zone of the OSF ring.

Next, in Japanese Laid-open Patent Application No. 9-202690, there is disclosed a silicon single crystal wafer consisting of a defect-free zone, which is substantially free of any degradation of the GOI, at a ratio in wafer area of not less than 50% or in a zone of 30 mm or over from the outer periphery, along with a manufacturing method thereof wherein the crystal wafer is grown at a pulling rate, which is 80 to 60% relative to a maximum pulling rate inherent to a furnace used. According to this method, a low oxygen concentration (corresponding to 17 ppma (JEIDA) or $8.5 \times 10^{17}$ atoms/Cm$^3$ (ASTM F1188-88)) is used, so that, as will described hereinafter, there is not formed any latent nucleus of OSF, or there is not formed any OSF when thermal oxidation treatment is carried out in a device manufacturing process.

According to this disclosure, it is clearly stated that FPD (flow pattern defect), LSTD (laser scattering tomography defect) and OSF do not exist in a defect-free zone where failure of GOI is not found, but no mentions is made of dislocation cluster. More particularly, it is not taken into account that dislocation clusters break out in the outside zone of the OSF ring under such manufacturing conditions as mentioned above, and any measure or procedure of preventing the occurrence of the dislocation cluster is not disclosed at all. Accordingly, it will be apparent that although the GOI characteristic is good in the outside zone of the OSF ring, such a characteristic failure as of pn junction leakage unfavorably takes place owing to the occurrence of the dislocation cluster.

Finally, in Japanese Laid-open Patent Application No. 8-330316, there is proposed a method wherein while appropriately controlling the pulling rate at the time of the growth of a single crystal and a temperature gradient within the crystal, only the outside zone of the OSF ring is extended throughout the crystal without formation of any dislocation cluster. However, this method requires both temperature gradient distributions in a radial direction and pulling rate to be extremely restricted conditions. This, in turn, requires new improvements in the growth of a silicon single crystal, which will become larger in size and has to be mass-produced.

SUMMARY OF THE INVENTION

The present invention has been made in view of the problems on methods of manufacturing a silicon single crystal according to the above-stated conventional Czochralski method, and has for its object the provision of a method for manufacturing a silicon single crystal wafer wherein the occurrence of OSF can be suppressed within a zone of latently generating an OSF ring within a wafer and the formation of dislocation clusters within the outside zone of the OSF ring can also be suppressed. In addition, such a manufacturing method has a wide process window, and its productivity is high.

The invention contemplates to solve the above problems and provide methods for manufacturing a silicon single crystal wafer set out under (1) and (2) below.

(1) A method for manufacturing a silicon single crystal having an oxygen concentration less than $8.5 \times 10^{17}$ atoms/cm$^3$ according to the Czochralski method, which comprises the steps of making a radius of a latent zone for OSF ring within a crystal surface in the range of 70% to 0% of a crystal radius, and controlling a value of V/G (mm$^2$/° C.·minute) at a predetermined critical value or over at radial positions except an outermost periphery of the crystal when a pulling rate is taken as V (mm/minute), and a crystalline temperature gradient along the pulling axis between specific temperatures within a range of the melting point of silicon to 1300° C. is taken as G (° C./mm).

(2) A method for manufacturing a silicon single crystal having an oxygen concentration not less than $8.5 \times 10^{17}$ atoms/cm$^3$ according to the Czochralski method, which comprises the steps of setting a pulling rate at 1.0 mm/minute or over, making a radius of a latent zone for OSF ring within a crystal surface in the range of 70% to 0% of a crystal radius, and controlling a value of V/G (mm$^2$/° C.·minute) at a predetermined critical value or over at radial positions except an outermost periphery of the crystal when a pulling rate is taken as V (mm/minute), and a crystalline temperature gradient along the pulling axis between specific temperatures within a range of the melting point of silicon to 1300° C. is taken as G (° C/mm).

In the methods of manufacturing a silicon single crystal wafer under (1) and (2) above, it is preferred that the crystalline temperature gradient G along the pulling axis is calculated from an average of temperature gradients of 1300° C. and 1400° C. by heat transfer calculation, and it had been better that V/G value is controlled at higher than predetermined critical value (0.20 mm$^2$/° C.·minute). The term "predetermined critical value" used herein is intended to mean, as described hereinafter, a limit at which it is controllable not to cause any dislocation cluster to occur within a crystal surface.

As stated before, the silicon single crystal wafer grown according to the Czochralski method may, in some cases, have OSF in a latent, OSF-occurring zone when subjected to high temperature thermal treatment in an oxidative atmosphere in a device manufacturing step. This is because an oxygen precipitation nucleus existing in the OSF ring occurring zone in the crystal grows by the high temperature thermal treatment, thereby inducing OSF as a secondary defect. The ring likely distributed zone of OSF, i.e. the zone where latent nuclei of OSF exist as ring likely, is hereinafter referred to merely as "OSF ring occurring zone" or "OSF ring occurring position".

BRIEF DESCRIPTION OF THE DRAWINGS

FIGS. 4A and 4B are, respectively, views illustrating distributions of crystal defects observed via X-ray topography in Example 1, in which

FIGS. 5A and 5B are, respectively, views showing the distribution of a value of V/G along a radial direction within a wafer determined according to heat transfer analyses using pulling rates indicated in FIG. 4A or 4B wherein FIG. 6B shows a defect distribution of the crystal grown in hot zone B.

DESCRIPTION OF THE PREFERRED EMBODIMENTS

In order to achieve the object of the invention, we have paid attention to and made extensive studies on improvements of conditions of growing a single crystal according to the Czochralski method whereby a zone of causing an OSF ring to occur within a wafer is limited to a specific range close to the center of the wafer thereby enlarging a precipitation-enhanced zone or a defect-free zone present in the proximity with the outside zone of the OSF ring toward a wider zone of the wafer. The position where the OSF ring occurs or breaks out is indicated in terms of a position corresponding to a ring outer diameter. Accordingly, the case where the OSF ring appears at the center of a crystal is expressed as 0% of the radius of a crystal.

With regard to the OSF ring occurring position, it has been made clear when a pulling rate is taken as V (mm/minute) and a crystalline temperature gradient along the pulling axis at specific temperatures (e.g. 1400° C. and 1300° C.) within a range of the melting point of silicon to 1300° C. is taken as G (° C./mm), the occurring position is influenced by the value of V/G. The radius of the OSF ring depends substantially on the pulling rate of a single crystal for a manufacturing furnace having the same structure. In this connection, however, when a hot zone structure is changed, the radius of the OSF ring also changes at the same pulling rate. The proper control of the value of V/G permits the radius of the OSF ring to be substantially univocally set at a given level, thereby controlling the occurring zone of the OSF ring.

The temperature distribution within a crystal necessary for the calculation of the temperature gradient G (° C./mm) can be determined from actual measurement or from heat transfer calculation according to the following procedure (1) to (3). (1) One procedure includes inserting a thermocouple into a crystal by a simulated experiment to actually measure a temperature in the crystal. (2) Another procedure includes optically measuring (e.g. by means of a CCD camera) the surface temperature at a specific site of a crystal being pulled and assuming the temperature in the inside of the crystal from the interrelation between the measured surface temperature and the measurement of (1). (3) A further procedure is to calculate the temperature in the inside of a crystal from various measurable temperature and physical values, to which a synthetic heat transfer analysis is added. (e.g. S. Miyahara et al, Journal of Crystal Growth 99,696 (1990), and T. Fujiwara et al, Journal of Crystal Growth, 128,275 (1993)).

In the practice of the invention, the temperature gradient G (° C./mm) may be calculated according to any of the procedures (1) to (3). Especially, when the heat transfer analysis is performed, the influence of the convection within a melt on the temperature distribution should be reflected thereon. To avoid this, the profile of the solid-liquid interface is measured on an actual crystal in order to obtain an accurate temperature distribution, especially, in a high temperature zone. Based on this measurement, the boundary conditions of the heat transfer analysis are corrected, from which the temperature distribution along the axial direction in the inside of the crystal should be calculated.

We calculated the temperature gradient G (° C./mm) as follows: temperature gradients of 1400° C. and 1300° C. were determined along the same axis parallel to the pulling direction, and the value of G (° C./mm) was calculated from an average value of these gradients. Thereafter, the value of V/G was calculated from pulling rates V. The calculation method of the temperature gradient within a crystal illustrated above is described only for example. Any method can be used for this purpose.

We found that the critical value of V/G, at which there is obtained a crystal without formation of any dislocation cluster, is at 0.20 mm²/° C.·minute. Thus, it will be seen that the value of V/G should be controlled at a level higher than the above value. More particularly, if the value of V/G is set at 0.20 mm²/° C. minute or over, any dislocation cluster is not formed in the wafer surface.

However, if the temperature gradient G (° C./mm) is calculated according to a different method, the critical value of V/G, at which any dislocation cluster is not formed, becomes different. Accordingly, the critical values of V/G, at which any dislocation cluster is not formed, have to be experimentally determined for different calculation methods of the temperature gradient G (° C./mm). While taking into account these critical values as a reference, a value of V/G should be properly controlled to obtain a crystal, which is substantially free of any dislocation cluster. One instance of such a control as mentioned above is described based on the heat transfer analysis, which we have carried out to check the influence of the value of V/G on the distribution of defects in the wafer surface.

Figure 1:
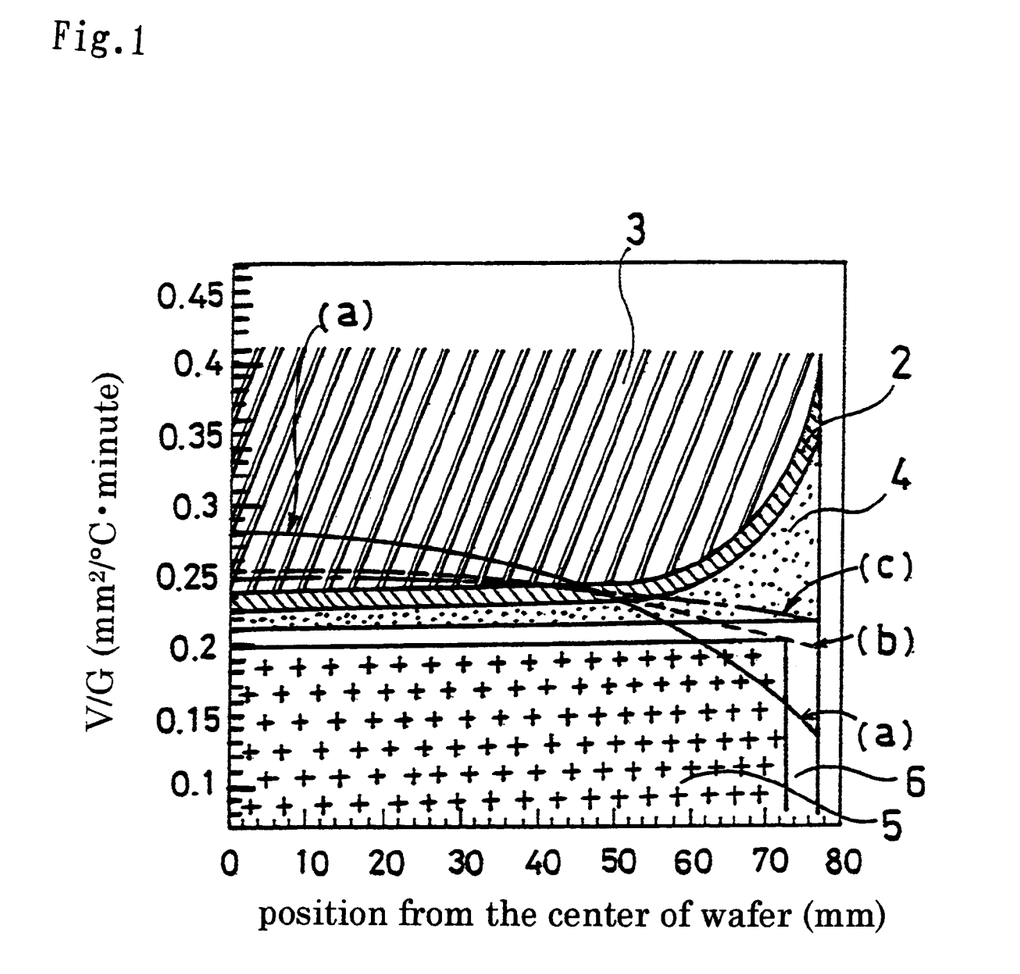
FIG. 1 is a view showing distributions of defects or faults occurring or appearing within a wafer wherein a radial position from the center of a wafer is taken as an abscissa and a value of V/G is taken as an ordinate.

FIG. 1 is a view showing a distribution of defects appearing within a wafer wherein a position along a radial direction from the center of a wafer is taken as an abscissa and a value of V/G as an ordinate. As shown in FIG. 1, the wafer surface is divided into an inside zone 3 and an outside zone relative to an OSF ring 2. The outside zone of the OSF ring is further divided into a precipitation-enhanced zone 4, a dislocation cluster zone 5 and a defect-free zone 6. Although the dislocation cluster zone is apprehensive of lowering device characteristics, there is no such problem on the precipitation-enhanced zone 4 and the defect-free zone 6. In the precipitation-enhanced zone 4, there is not produced any void defect serving to degrade GOI, or any dislocation cluster inviting a pn junction leakage. This zone is one wherein oxygen precipitation takes place when subjected to low temperature thermal treatment at approximately 800° C. or below. The defect-free zone 6 is one, which does not involve any void defect, dislocation cluster or oxygen precipitation as is caused by low temperature thermal treatment.

As will be apparent from FIG. 1, when the value of V/G is smaller than 0.20 mm²/° C.·minute, dislocation clusters are formed substantially in all the zones, except the surface layer at the peripheral portion. Usually, the peripheral portion, where no dislocation cluster is formed, is within a range of approximately 5 mm from the outermost periphery. As the value of V/G increases, the precipitation-enhanced zone 4 and the defect-free zone 6 increase in area at the outside zone of the OSF ring. Accordingly, in order that any dislocation cluster is not formed at the outside zone of the OSF ring, it is necessary that the value of V/G be set at 0.20 mm²/° C. minute or over at a portion except the outermost peripheral portion.

On the other hand, in order to improve the yield of devices which can be fabricated from one silicon single crystal wafer, the radius of OSF ring appearing in the crystal surface is defined within a range of 70% to 0% of the crystal radius. In general, the OSF ring occurring in the wafer surface has a width of several mm to about 10 mm. Accordingly, to make the radius of the OSF ring at 70% of the crystal radius means that the periphery of the OSF ring corresponds to 70% of the crystal radius, and likewise, to make the radius of OSF ring at 0% of the crystal radius indicates that the OSF ring disappears at the center of the crystal.

In order that the radius of the OSF ring is set within a range of 70% to 0% of the crystal radius, it is sufficient, according to the results of a study made by us, that an average pulling rate V at the time of the operation is controlled within a range of 70% to 40% of a maximum pulling rate Vmax inherent to the manufacturing furnace using the Czochralski method. The term "inherent maximum pulling rate" used herein means a rate at which an outer diameter of the resultant crystal is deformed to an extent that its circular form cannot be maintained when a pulling rate is increased beyond it. In this sense, the maximum pulling rate Vmax is a value inherent to the manufacturing furnace used, and changes depending on the structure of a hot zone.

Figure 2A:
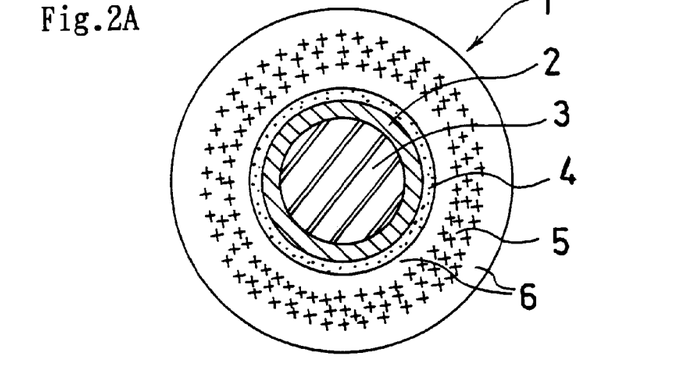
FIGS. 2A to 2C are, respectively, views showing distributions of defects where an OSF ring occurs substantially at a given radius within a range of 70% to 0% of the radius of a crystal using different types of manufacturing furnace.
Figure 2B:
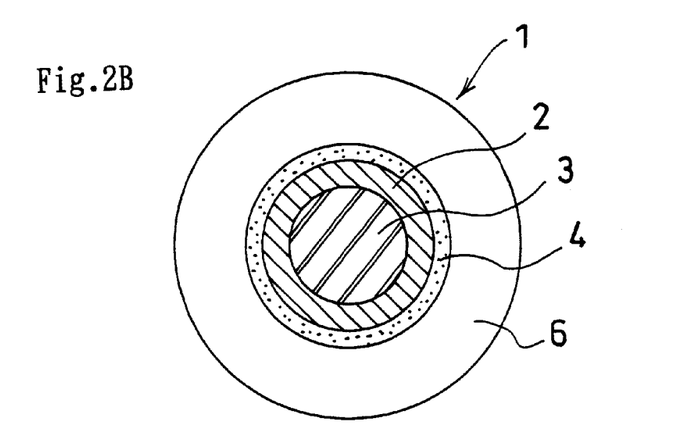
Figure 2C:
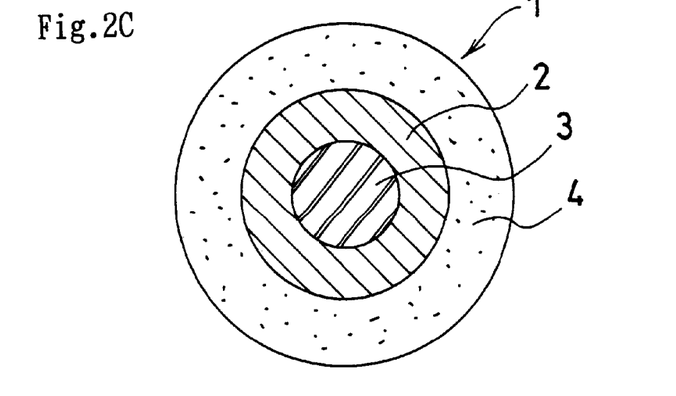

FIGS. 2A to 2C are, respectively, views showing distributions of defects in case where an OSF ring is broken out substantially at a given radius within a range of 70% to 0% of the radius of a crystal by use of different types of manufacturing furnaces. In FIGS. 2A to 2C, the OSF rings are set substantially in position by controlling an average pulling rate V, under operation, relative to an inherent maximum pulling rate Vmax of each manufacturing furnace. In FIG. 2A, the precipitation-enhanced zone 4 exists in the outside zone of the OSF ring in the proximity thereof, with the defect-free zone 6 and the dislocation cluster zone 5 extending at the outside thereof. In FIGS. 2B and 2C, any dislocation cluster zone 5 is not formed.

The reason why distributions of defects differ from one another in spite of substantially the same occurring positions of the OSF ring as described above resides in the difference in the distribution of V/G which is caused by the structure of the hot zone of the manufacturing furnace. In FIG. 1, there is shown the relation between the radial position from the center of the wafer corresponding to FIGS. 2A, 2B and 2C and the distribution of V/G, in which an average value of a temperature gradient at crystallization temperatures of 1400° C. and 1300° C. is taken as G. It will be seen that in order not to cause any dislocation cluster to appear in the outside zone of the OSF ring as in FIGS. 2B and 2C, the value of V/G along the radial direction except the outermost periphery in a manufacturing furnace with a specific type of hot zone structure should be set at 0.20 mm²/° C.·minute or over.

As described hereinbefore, the silicon single crystal wafer manufactured according to the Czochralski method becomes high in quality and does not involve any dislocation cluster in the outside zone of the OSF ring without lowering device characteristics provided that the radius of the OSF ring is controlled within a range of 70% to 0% of the radius of the crystal and a temperature distribution within the hot zone is so controlled that the value of V/G along the radial direction of the crystal runs across a zone not causing any dislocation cluster to be formed.

It will be noted that the silicon single crystal grown according to the Czochralski method contains oxygen impurities structurally melted out from a quartz crucible, in which molten materials are accommodated. If the oxygen content in the silicon single crystal is at $8.5 \times 10^{17}$ atoms/cm³ or over, OSF may be induced in the OSF ring occurring zone when a high temperature thermal treatment is carried out in an oxidative atmosphere in the device manufacturing process. Such OSF is one of factors of degrading various device characteristics, thereby lowering the device yield. In this connection, however, if the oxygen concentration in the silicon single crystal is less than $8.5 \times 10^{17}$ atoms/cm³, OSF is not induced in the OSF ring occurring zone if the thermal treatment is performed. The reason why OSF is not visualized is that the precipitation nuclei formed in the single crystal being grown cannot be grown up, owing to the low concentration of oxygen, to a size enough to induce OSF.

On the other hand, when the oxygen concentration is at $8.5 \times 10^{17}$ atoms/cm³ or over, it has to be assumed that OSF is induced in the occurring zone of the OSF ring. In this case, however, when the silicon single crystal is grown at a pulling rate of 1.0 mm/minute or over, the occurrence of OSF can be suppressed. More particularly, the oxygen precipitation nuclei, which serve as nuclei for OSF formation in the ring zone, are formed within a temperature range of about 1000° C. to 850° C. in the process of cooling at the time of the growth of the crystal. When the pulling rate is set at 1.0 mm/minute or over, the temperature range, within which the oxygen precipitation nuclei are formed, can be passed through quickly, thereby suppressing the growth of the latent nuclei for OSF.

EXAMPLES

The invention is more particularly described by way of Examples 1 and 2.

Example 1

Using a manufacturing apparatus for carrying out the Czochralski method which had a 18" Φ quartz crucible and a carbon crucible set therein and which was capable of growing a 6" Φ single crystal, a single crystal was pulled. The conditions including a relative position between a cylindrical carbon heater set around the crucible and the crucible, the distance between the tip of an irradiation shielding body of a semi-conical form, which was set about the crucible, was made of carbon, and had a thickness of 5 mm and an aperture of 200 mm, and the melt surface, and the insulating structure provided around the heater, were investigated according to the heat transfer analyses, followed by determination of a ratio between the pulling rate V (mm/minute) and the crystalline temperature gradient G (° C./mm) along the pulling axis, i.e. a value of V/G. It will be noted that the temperature gradient was an average value of temperature gradients of 1400° C. and 1300° C.

Figure 3:
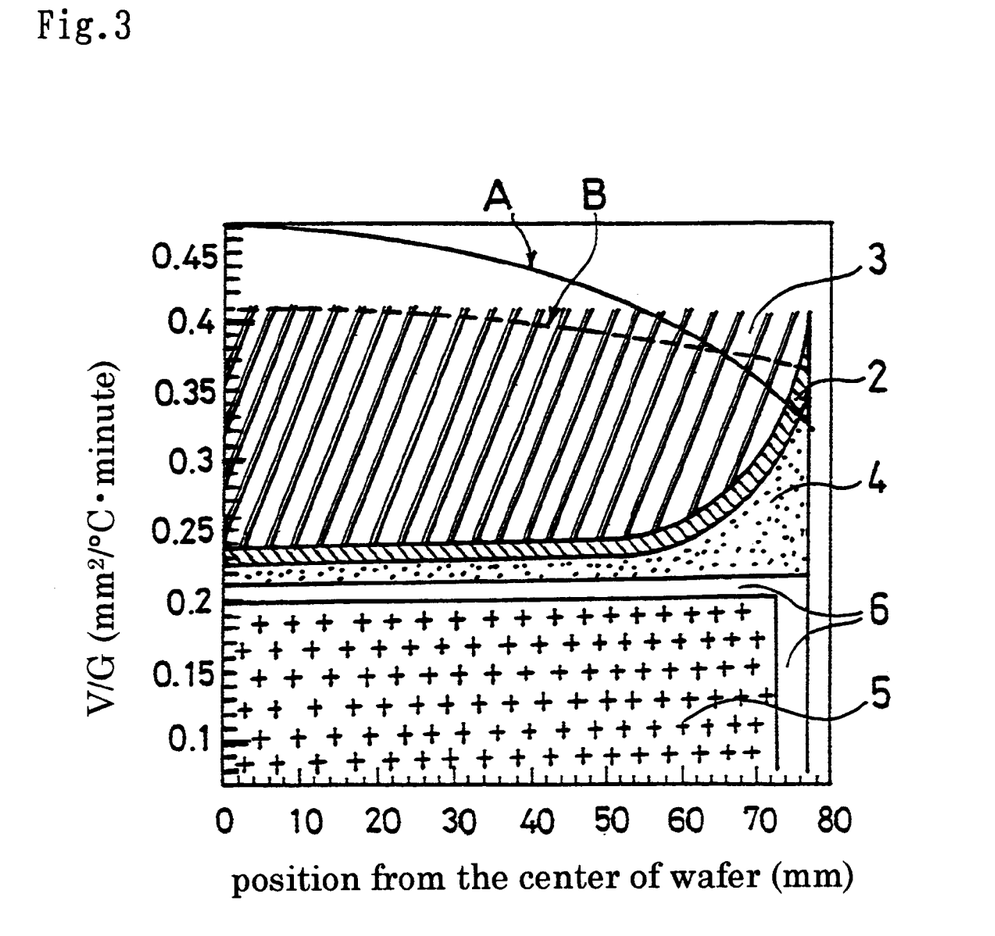
FIG. 3 is a view showing a value of V/G (mm$^2$/° C.·minute) in two hot zones A, B used in Example 1.

FIG. 3 is a view showing values of V/G ($mm^2$/° C.·minute) in the two hot zones A, B used in Example 1. The maximum pulling rate was at 1.8 mm/minute in hot zone A and at 1.4 mm/minute in hot zone B.

65 kg of highly pure polycrystalline silicon was placed in a quartz crucible, and was doped with boron, followed by melting by application of heat. Thereafter, a single crystal having a diameter of 150 mm (6") with a growth direction of the crystal of <100> and a resistivity of about 10 Ωcm was grown while gradually decreasing a pulling rate at a constant rate such that the pulling rate was at 1.8 mm/minute at 100 mm from below the crystal shoulder and was at 0.4 mm/minute at 500 mm from below the shoulder. For the growth in hot zone B, the pulling rate was gradually decreased so that the rate was at 1.4 mm/minute at 100 mm from below the shoulder and at 0.4 mm/minute at 500 mm from below the shoulder. Subsequently, these crystals were grown at distances of from 500 mm or over from below the shoulder to 700 mm at a pulling rate of 0.4 mm/minute, followed by tailing process by a usual manner and completion of the growth.

The crystal obtained after the growth was cut out, in parallel to the pulling axis of the crystal, into pieces having a thickness of 1.5 mm, followed by immersion of the piece in a mixed acid solution consisting of HF (hydrofluoric acid) and $HNO_3$ (nitric acid) to remove the cutting damage by dissolution, further immersion in a dilute HF solution and rinsing with ultrapure water and drying. The measurement of the resultant samples by FT-IR with respect to the interstitial oxygen concentration revealed that it was less than 7.0 to $8.5 \times 10^{17}$ atoms/$cm^3$. These samples were initially thermally treated in an atmosphere of dry oxygen under conditions of 800° C.×4 hours and 1000° C.×16 hours, and subjected to X-ray topography to check the state of occurrence of crystal defects. Another sample wafer was immersed in a 1000 ppm $CuNO_3$ aqueous solution and naturally dried, followed by thermal treatment in an atmosphere of nitrogen under conditions of 900° C.×20 minutes. Thereafter, this sample was immersed in a mixed acid solution consisting of HF and $HNO_3$, from which a surface silicide layer was removed by etching in a thickness of several 10 μm, followed by X-ray topography to check a distribution of Cu decoration.

Figure 4A:
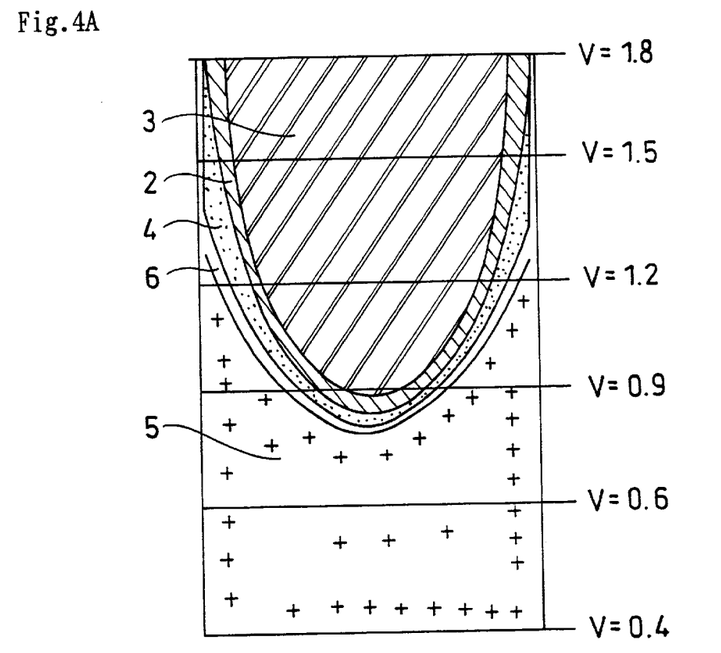
FIG. 4A shows a distribution of crystal defects gown in hot zone A and FIG. 4B is a distribution of crystal defects grown in hot zone B.
Figure 4B:
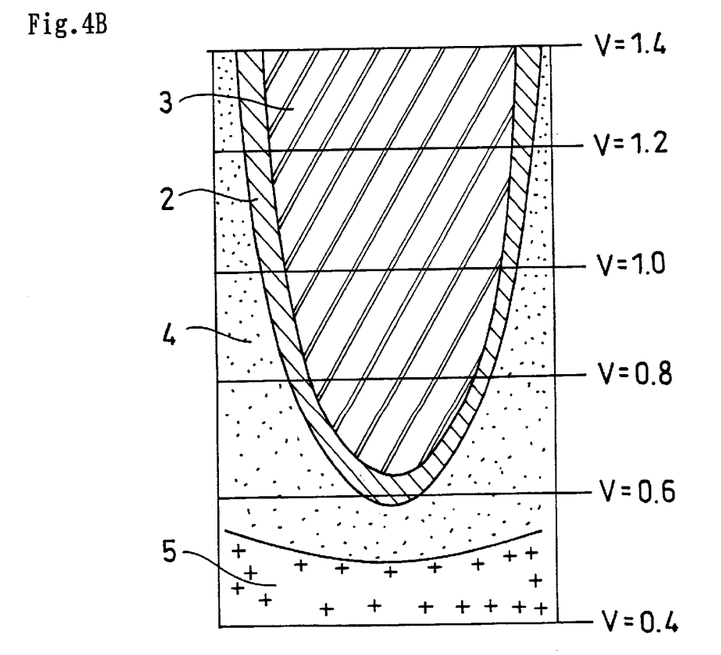

FIGS. 4A to 4B are, respectively, views showing the distribution of crystal defects observed with the X-ray topography in Example 1. FIG. 4A showing a defect distribution of a crystal grown in hot zone A, and FIG. 4B shows a defect distribution of a crystal grown in hot zone B. The ordinates in FIGS. 4A and 4B, respectively, indicate a pulling rate (1.8 mm/minute to 0.4 mm/minute) in hot zone A, and a pulling rate (1.4 mm/minute to 0.4 mm/minute) in hot zone B.

Figure 5A:
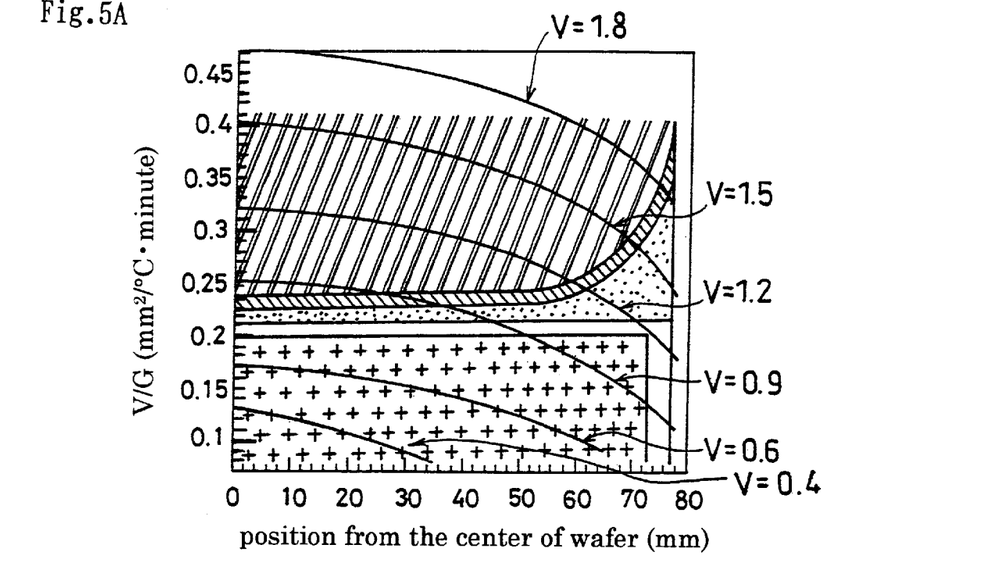
FIG. 5A shows the case of the crystal grown in hot zone A and FIG. 5B is the case of the crystal grown in hot zone B.
Figure 5B:
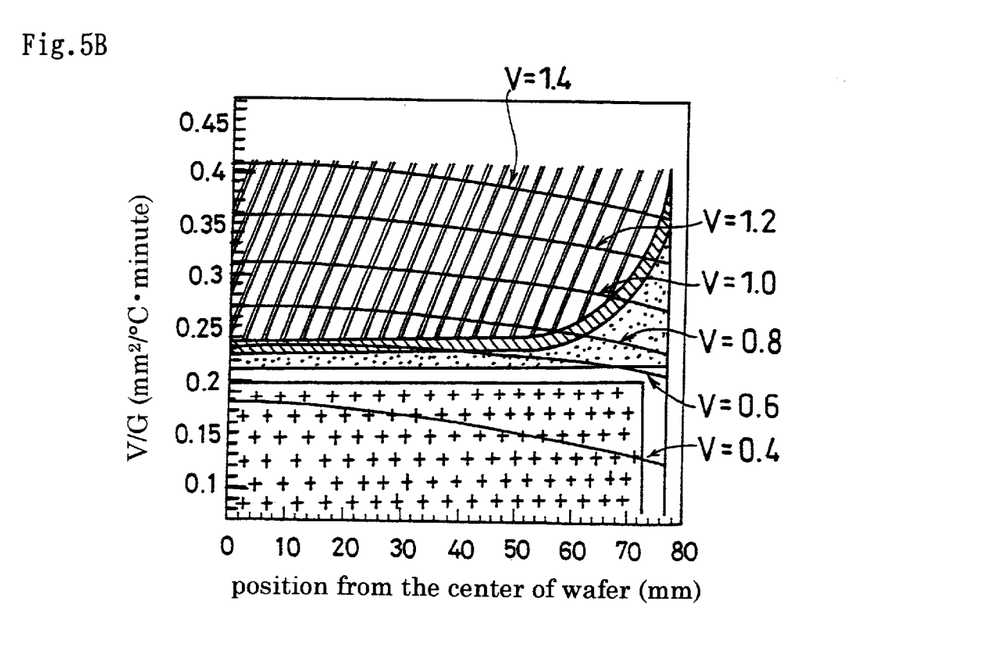

FIGS. 5A to 5B are, respectively, views showing a distribution of the values of V/G along the radial direction within a wafer when determined by heat transfer analyses at the pulling rates indicated in FIGS. 4A and 4B. More particularly, FIG. 5A shows the case of the growth in hot zone A, and FIG. 5B shows the case of the growth in hot zone B. From the results of FIGS. 4A, 4B, 5A and 5B, it was confirmed that where the value of V/G was 0.20 $mm^2$/° C. minute or over, the precipitation enhanced zone and the defect-free zone extend in the outside zone of the OSF ring without formation of any dislocation cluster.

Moreover, a further sample was thermally treated in an atmosphere of dry oxygen under conditions of 1100° C.×16 hours and oxidized. The resultant oxide film was removed by means of a HF aqueous solution, followed by preferential etching with a Wright etchant for about 5 minutes to check the state of occurrence of OSF. As a result, no occurrence of OSF was recognized. From these results, it was confirmed that where the oxygen concentration is less than $8.5 \times 10^{17}$ atoms/$cm^3$, no OSF was formed in the occurring zone of the OSF ring.

Example 2

Using the manufacturing furnace of Example 1 for carrying out the Czochralski method which was capable of growing a 6" Φ single crystal, a single crystal was further pulled. The growth of the single crystal was made in two hot zones A, B wherein the maximum pulling rate was likewise at 1.8 mm/minute in hot zone A and at 1.4 mm/minute in hot zone B. After a single crystal was grown under the same conditions as in example 1 except the rotation rate of the crucible, the state of occurrence of defects in the crystal was checked in the same manner as in example 1.

Figure 6A:
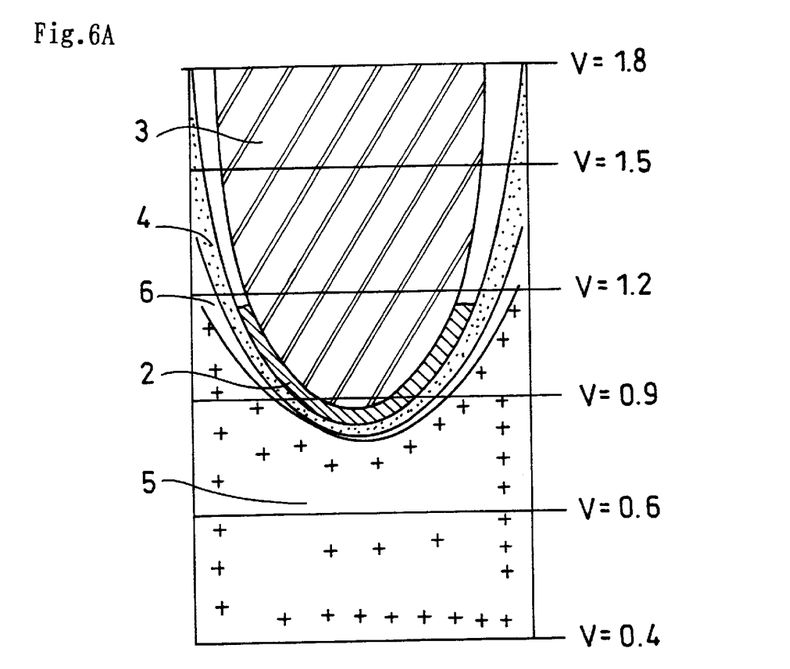
FIGS. 6A and 6B are, respectively, views showing the distribution of defects observed in the same manner as in Example 1, wherein FIG. 6A shown a defect distribution of the crystal grown in hot zone A
Figure 6B:
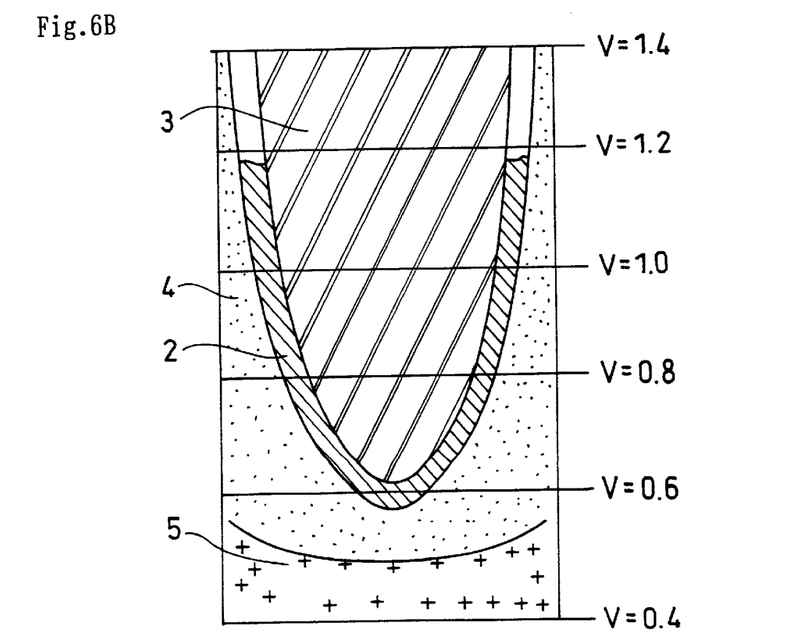

FIGS. 6A and 6B are, respectively, views showing the distribution of defects of Example 2 in the same manner as in Example 1, in which FIG. 6A shows the defect distribution of the crystal grown in hot zone A and FIG. 6B shows the defect distribution of the crystal grown in hot zone B. The interstitial oxygen concentration in the crystals was found to be at 8.5 to $10.0 \times 10^{17}$ atoms/$cm^3$. The state of occurrence of the OSF ring and the dislocation cluster were substantially similar to those of Example 1, no significant difference was not recognized.

The state of occurrence of OSF in the crystal surface was checked in the same manner as in Example 1. As a result, it was found that when the pulling rate was smaller than 1.0 mm/minute, the occurrence of OSF was observed in the occurring zone of the OSF ring for the crystals grown in both hot zones A and B. In contrast, any OSF was not recognized in the zone where a crystal was grown at a pulling rate of 1.0 mm/minute or over. These results reveal that where a crystal was grown at a pulling rate of 1.0 mm/minute or over, OSF was not induced in the occurring zone of the OSF ring.

As described hereinbefore, according to the method of the invention, any dislocation cluster is not formed in the outside of the occurring zone of the OSF ring within the single crystal wafer surface, thereby establishing a defect-free zone instead. In addition, irrespective of the oxygen concentration in the crystal, no latent nucleus of the OSF ring is formed, and thus, OSF is not induced in the occurring zone of the OSF ring. In this way, there can be manufactured a single crystal wafer which is free of crystal defects and has good device characteristics.

What is claimed is:

1. A method for manufacturing a silicon single crystal according to the Czochralski method, the method comprising the steps of making a radius of a latent zone for oxidation induced stacking faults distributed within a crystal surface in the range of 70% to 0% of a crystal radius, and controlling a value of V/G ($mm^2/°$ C.·min) at a critical value or over at radial positions except an outermost periphery of the crystal when a pulling rate is taken as V (mm/minute), and a crystalline temperature gradient along a pulling axis between specific temperatures within a range of the melting point of silicon to 1300° C. is taken as G (° C./mm).

2. A method for manufacturing a silicon single crystal according to claim 1, wherein the crystalline temperature gradient G is calculated from an average value of temperature gradients at 1300° C. and 1400° C. through heat transfer calculation.

3. A method for manufacturing a silicon single crystal according to claim 1, wherein the critical value of V/G ($mm^2/°$ C.·min) is set at 0.20 $mm^2/°$ C.·min.

4. A method for manufacturing a silicon single crystal according to claim 1, wherein any dislocation cluster does not occur at an outside of the latent zone of ring likely distributed oxidation induced stacking faults.

5. A method for manufacturing a silicon single crystal having an oxygen concentration less than $8.5 \times 10^{17}$ atoms/$cm^3$ according to the Czochralski method, the method comprising the steps of making a radius of a latent zone for oxidation induced stacking faults within a crystal surface in the range of 70% to 0% of a crystal radius, and controlling a value of V/G ($mm^2/°$ C.·min) at a critical value or over at radial positions except an outermost periphery of the crystal when a pulling rate is taken as V (mm/minute), and a crystalline temperature gradient along the pulling axis between specific temperatures within a range of the melting point of silicon to 1300° C. is taken as G (° C./mm).

6. A method for manufacturing a silicon single crystal according to claim 5, wherein the crystalline temperature gradient G is calculated from an average value of temperature gradients at 1300° C. and 1400° C. through heat transfer calculation.

7. A method for manufacturing a silicon single crystal according to claim 5, wherein the critical value of V/G ($mm^2/°$ C.·min) is set at 0.20 $mm^2/°$ C.·min.

8. A method for manufacturing a silicon single crystal according to claim 5, wherein any dislocation cluster does not occur at an outside of the latent zone of ring likely distributed oxidation induced stacking faults.

9. A method for manufacturing a silicon single crystal having an oxygen concentration not less than $8.5 \times 10^{17}$ atoms/$cm^3$ according to the Czochralski method, the method comprising the steps of making a radius of a latent zone for oxidation induced stacking faults within a crystal surface in the range of 70% to 0% of a crystal radius, and controlling a value of V/G $mm^2/°$ C.·min) at a critical value or over at radial positions except an outermost periphery of the crystal when a pulling rate is taken as V (mm/minute), and a crystalline temperature gradient along the pulling axis between specific temperatures within a range of the melting point of silicon to 1300° C. is taken as G (° C./mm).

10. A method for manufacturing a silicon single crystal according to claim 9, wherein the crystalline temperature gradient G is calculated from an average value of temperature gradients at 1300° C. and 1400° C. through heat transfer calculation.

11. A method for manufacturing a silicon single crystal according to claim 9, wherein the critical value of V/G ($mm^2/°$ C. min) is set at 0.20 $mm^2/°$ C.·min.

12. A method for manufacturing a silicon single crystal according to claim 9, wherein any dislocation cluster does not occur at an outside of the latent zone of ring likely distributed oxidation induced stacking faults.

* * * * *